United States Patent [19]

Sato et al.

[11] Patent Number: 5,185,235
[45] Date of Patent: Feb. 9, 1993

[54] REMOVER SOLUTION FOR PHOTORESIST

[75] Inventors: Hiromitsu Sato, Chigasaki; Kenji Tazawa, Samukawa; Toshimi Aoyama, Fujisawa, all of Japan

[73] Assignee: Tokyo Ohka Kogyo Co., Ltd., Kawasaki, Japan

[21] Appl. No.: 504,070

[22] Filed: Mar. 30, 1990

Related U.S. Application Data

[63] Continuation-in-part of Ser. No. 236,479, Aug. 25, 1988, abandoned.

[30] Foreign Application Priority Data

Sep. 9, 1987 [JP] Japan ................................ 62-224109
Mar. 10, 1988 [JP] Japan ................................ 63-54896

[51] Int. Cl.$^5$ ........................... G03C 5/00; B08B 7/00; B44C 1/22; C11D 3/43
[52] U.S. Cl. .................................... 430/331; 430/309; 430/325; 430/329; 134/40; 134/42; 156/659.1; 252/162; 252/170; 252/171; 252/172
[58] Field of Search ............... 252/153, 162, 170, 171, 252/172, 547; 134/40, 42; 156/344, 659.1; 430/309, 325, 329, 331

[56] References Cited

U.S. PATENT DOCUMENTS

| | | | |
|---|---|---|---|
| 4,187,191 | 2/1980 | Simpson, Jr. ....................... | 252/171 |
| 4,239,661 | 12/1980 | Muraoka et al. ..................... | 430/331 |
| 4,395,348 | 7/1983 | Lee ...................................... | 430/331 |
| 4,396,703 | 8/1983 | Matsumoto et al. ................ | 430/331 |
| 4,592,787 | 6/1986 | Johnson ............................... | 252/171 |
| 4,744,834 | 5/1988 | Hag ..................................... | 430/331 |
| 4,801,519 | 1/1989 | Koibuchi et al. .................... | 430/331 |
| 4,904,571 | 2/1990 | Miyashita et al. ................... | 430/331 |

FOREIGN PATENT DOCUMENTS

| | | | |
|---|---|---|---|
| 3050838 | 3/1988 | Japan ................................... | 430/331 |
| 05314 | 9/1987 | PCT Int'l Appl. .................. | 430/329 |

Primary Examiner—Hoa Van Le
Attorney, Agent, or Firm—Nikaido, Marmelstein, Murray & Oram

[57] ABSTRACT

The remover solution of the invention comprises (A) from 35 to 80% by weight of an alcoholic solvent such as ethylene glycol monoethyl ether, (B) from 10 to 40% by weight of an organic solvent which is a halogenated hydrocarbon solvent, e.g., 1,2-dichlorobenzene and methylene chloride, an ether solvent, e.g., tetrahydrofuran, or an aromatic solvent, e.g., benzene and xylene, and (C) from 0.1 to 25% by weight of a quaternay ammonium compound such as tetramethyl ammonium hydroxide and trimethyl hydroxyethyl ammonium hydroxide. Different from conventional remover solutions which only can swell cured photoresist compositions, the inventive remover solution has a power to completely dissolve a cured photoresist layer to give a quite satisfactory result in the removing works of patterned photoresist layers in the manufacture of semiconductor devices.

8 Claims, No Drawings

REMOVER SOLUTION FOR PHOTORESIST

This application is a continuation-in-part of application Ser. No. 236,479 filed Aug. 25, 1988, now abandoned.

BACKGROUND OF THE INVENTION

The present invention relates to a remover solution for photoresist or, more particularly, to a remover solution for a photopolymerization-type photoresist containing an acrylic resin or a positive-working photoresist containing a phenolic resin.

Photopolymerization-type photoresist compositions containing an acrylic resin are widely used in the prior art in the manufacturing process of various kinds of electronic components such as printed circuit boards, substrates of semiconductor devices and the like with an object to form a protecting film on the substrate surface as an etching resist, soldering resist, plating resist and the like.

To outline the manufacturing process by using a photopolymerization-type photoresist composition containing an acrylic resin, the surface of a substrate is coated with the photopolymerization-type photoresist composition in the form of a solution followed by drying and then the coating film of the resist composition is exposed patternwise to actinic rays such as ultraviolet light through a negative photomask bearing a desired pattern followed by a development treatment to form a patterned resist layer. Thereafter, the substrate surface is subjected to a treatment of etching, soldering, plating and the like selectively with the patterned resist layer as the protecting film for the substrate surface. After completion of the treatment, the patterned photoresist layer is removed by using a solvent or a solvent mixture which is called a remover.

It is known that conventional removers for removing a patterned resist layer contain, as the principal ingredient thereof, one or more of chlorinated hydrocarbon solvents such as trichloroethylene, methylene chloride and the like. These conventional removers have several disadvantages and problems.

For example, a photoresist composition cured by exposure to actinic rays such as ultraviolet light cannot be dissolved by these removers containing the above mentioned chlorinated hydrocarbon solvents but the cured photoresist layer is merely swollen with the solvents so that the swollen photoresist layer falls off the substrate surface in pieces. Accordingly, drawbacks are sometimes unavoidable that removal of the photoresist layer is incomplete to leave residue of the photoresist layer on the substrate surface or the photoresist layer which has once fallen in pieces from the substrate surface may be re-deposited on the substrate surface resulting in the occurrence of unacceptable products.

Moreover, a remover solution once used in a removing process sometimes contain pieces of the swollen photoresist layer suspended therein so that a remover solution once used cannot be re-used as such without being freed from the suspended pieces of the swollen photoresist layer to cause an economical disadvantage.

It is therefore eagerly desired to develop an efficient remover solution which can completely dissolve a photocured resist layer on the substrate surface to solve the above mentioned problems in the prior art remover solutions but no successful proposals have yet been made to provide a remover solution as desired.

SUMMARY OF THE INVENTION

The inventors have conducted extensive investigations with an object to solve the above mentioned problems in the prior art remover solutions arriving at an unexpected discovery on the base of which the present invention has been completed.

Thus, the remover solution provided by the invention comprises, in admixture:

(A) an alcoholic solvent in a weight fraction, preferably, in the range from 35 to 80%;

(B) an organic solvent selected from the group consisting of halogenated hydrocarbon solvents, ether solvents and unhalogenated aromatic solvents in a weight fraction, preferably, in the range from 10 to 40%; and (C) a quaternary ammonium salt in a weight fraction, preferably, in the range from 0.1 to 25%.

DETAILED DESCRIPTION OF THE PREFERRED EMBODIMENTS

As is described above, the remover solution of the invention is characterized by the quaternary ammonium salt as the component (C) dissolved in a solvent mixture composed of the components (A) and (B). The quaternary ammonium salt can be added to the solvent mixture either as such or as a solution prepared beforehand by dissolving the same in a small volume of a solvent which may be water or a lower alcohol such as methyl and ethyl alcohols selected in consideration of the miscibility thereof with the components (A) and (B) as the principal solvents of the inventive remover solution. The amount of the quaternary ammonium salt as the component (C) in the inventive remover solution is preferably in the range from 0.1 to 25% by weight or, more preferably, in the range from 1 to 20% by weight. When the amount of the quaternary ammonium salt is too small, the remover solution cannot exhibit the desired dissolving power to the cured photoresist composition. When the amount thereof in the remover solution is increased over the above mentioned upper limit, an economical disadvantage is caused without further increase in the dissolving power of the remover solution to the cured photoresist composition.

Examples of suitable quaternary ammonium compound include tetramethyl ammonium hydroxide, trimethyl hydroxyethyl ammonium hydroxide, i.e. choline, tetra(hydroxyethyl) ammonium hydroxide, methyl tri(hydroxyethyl) ammonium hydroxide and the like. These quaternary ammonium compounds can be used either singly or as a combination of two kinds or more according to need.

The component (A) in the inventive remover solution is an alcoholic solvent which is exemplified by methyl alcohol, ethyl alcohol, propyl alcohol, 3-methyl-3-methoxy butyl alcohol, ethylene glycol monomethyl ether, ethylene glycol monoethyl ether, ethylene glycol monobutyl ether, diethylene glycol monomethyl ether, diethylene glycol monoethyl ether, propylene glycol monomethyl ether, dipropylene glycol monomethyl ether and the like. These alcoholic solvents can be used either singly or as a combination of two kinds or more according to need. It is of course optional that the alcoholic solvent as the component (A) is the same one as that used in dissolving the quaternary ammonium compound to prepare a solution thereof in advance.

The amount of the alcoholic solvent as the component (A) in the inventive remover solution is preferably in the range from 35 to 80% by weight or, more preferably, in the range from 40 to 75% by weight. The desired dissolving power of the remover solution to a cured photoresist composition can be fully exhibited only when the amount of the alcoholic solvent is within the above mentioned range.

The component (B) in the inventive remover solution is a solvent to be combined with the alcoholic solvent as the component (A) to form a solvent mixture and selected from three classes of organic solvents. The first class of the organic solvents as the component (B) includes halogenated hydrocarbon solvents exemplified by 1,2-dichlorobenzene, tetrachloroethylene, trichloroethylene, methylene chloride, 1,1,1-trichloroethane, chlorobenzene, 1,2,4-trichlorobenzene, bromobenzene, 1,2-dibromobenzene, 4-chlorotoluene, 3-chlorotoluene and the like. These halogenated hydrocarbon solvents can be used either singly or as a combination of two kinds or more according to need.

The second class of the organic solvents as the component (B) of the inventive remover solution includes unhalogenated aromatic solvents exemplified by benzyl alcohol, benzene, toluene, xylene, ethyl benzene, p-cresol, amyl benzene and naphthalene as well as certain commercially available solvent mixtures such as Swasol (a product by Maruzen Petroleum Co.) which is a mixture of tri- or tetramethyl benzene, alkyl toluenes, branched-alkyl benzenes, cymene, diethyl benzene, naphthalene, mono- and dimethyl naphthalenes and the like. These aromatic solvents can be used either singly or as a combination of two kinds or more according to need.

The third class of the organic solvents as the component (B) of the inventive remover solution includes ether solvents exemplified by dioxane, tetrahydrofuran, diethylene glycol dimethyl ether, triethylene glycol dimethyl ether, tetraethylene glycol dimethyl ether, ethylene glycol diethyl ether, diethylene glycol diethyl ether, diethylene glycol dibutyl ether and the like. These ether solvents can be used either singly or as a combination of two kinds or more according to need.

It is also optional that two kinds or more of the organic solvents belonging to two or three different classes mentioned above are used in combination. The amount of the component (B) in the inventive remover solution is preferably in the range from 10 to 40% by weight or, more preferably, in the range from 15 to 30% by weight. The desired dissolving power of the remover solution to a cured photoresist composition can be fully exhibited only when the amount of the component (B) is within the above mentioned range.

The above described combination of the components (A), (B) and (C) is essential in order that the remover solution may exhibit the full dissolving power to a cured photoresist composition because such a dissolving power as desired cannot be obtained by a combination of a quaternary ammonium compound or an aqueous solution thereof and an alcoholic solvent, by a combination of an aqueous solution of a quaternary ammonium compound and a halogenated hydrocarbon solvent, ether solvent and/or aromatic solvent, or by a combination of an alcoholic solvent and a halogenated hydrocarbon solvent, ether solvent and/or aromatic solvent which can exhibit only a swelling effect on the cured photoresist composition resulting in falling of the swollen photoresist layer in pieces off the substrate surface without being dissolved.

If desired, the remover solution of the invention can be admixed with various kinds of known additives such as surface active agents and the like.

The remover solution of the present invention can be used with a particularly high removing efficiency in the removing works of a cured and patterned photoresist layer of a photopolymerization-type photoresist composition containing an acrylic resin or a positive-working photoresist composition containing a phenolic resin. Examples of such a photopolymerization-type photoresist composition include those comprising, as the resinous ingredient thereof, a homopolymer or copolymer of one kind or two kinds or more of the monomers such as acrylic acid, methacrylic acid, methyl acrylate, methyl methacrylate, ethyl acrylate, ethyl methacrylate, hydroxyethyl acrylate, hydroxyethyl methacrylate, propyl acrylate, propyl methacrylate, hydroxypropyl acrylate, hydroxypropyl methacrylate, glycidyl acrylate, glycidyl methacrylate, butylaminoethyl acrylate, butylaminoethyl methacrylate, dibromopropyl acrylate, dibromopropyl methacrylate, acrylamide, methacrylamide, acrylonitrile, methacrylamide and the like, compounded with a photopolymerizable monomer and a photopolymerization initiator. The resinous ingredient mentioned above can be a copolymer of one or more of the above named monomers with other monomers such as styrene, α-methyl styrene, vinyl toluene, butadiene, maleic anhydride and the like. The photopolymerization-type photoresist composition can be admixed with various kinds of known additives such as thermal polymerization inhibitors, antioxidants, antifoam agents, dyes, pigments, fillers and the like. The positive-working photoresist compositions, on the other hand, include those compounded with a phenol novolac resin and a compound having a naphthoquinone diazide group in the molecule.

The remover solution of the present invention can be used in the same manner as in the use of conventional remover solutions. Namely, the photoresist layer on the substrate surface formed with a photopolymerization-type or positive-working photoresist composition is exposed patternwise to actinic rays to which the photoresist layer has sensitivity such as ultraviolet light through a patterned photomask followed by a development treatment to dissolve away the photoresist layer in the unexposed area, when the photoresist composition is of the photopolymerization type, or in the exposed area, when the photoresist composition is of the positive-working type, with the developer solution to leave the photoresist layer in a desired pattern. Thereafter, the substrate surface not covered by the patterned photoresist layer is subjected to a treatment of plating, etching and the like. Finally, the patterned photoresist layer is removed by using the remover solution of the invention which has a power to dissolve the cured photoresist layer. The removing treatment using the inventive remover solution to dissolve the photoresist layer is usually carried out by dipping the substrate in the remover solution in view of the efficiency and economical advantage. Thus, the substrate bearing the patterned photoresist layer is put into the remover solution of the invention contained in a dish which is preferably joggled to move the solution so that the photoresist layer is dissolved in the solution and removed off the substrate surface. This treatment is performed preferably at a temperature in the range from 40° to 70° C. so that the photoresist layer can be completely dissolved and removed within about 5 to about 30 minutes though dependent on the type of the photoresist composition and thickness of the photoresist layer.

In the following, the remover solution of the invention is described in more detail by way of examples.

EXAMPLE 1 (EXPERIMENTS NO. 1 TO NO. 28)

A photopolymerization-type photoresist composition containing an acrylic resin was prepared by uniformly mixing:

100 parts by weight of a copolymer of methyl methacrylate, butyl methacrylate and hydroxypropyl methacrylate in a weight proportion of 70:20:10 having a molecular weight of about 50,000;

25 parts by weight of tetraethylene glycol diacrylate;

5 parts by weight of trimethylol propane triacrylate;

5 parts by weight of 2,2-dimethoxy-2-phenyl acetophenone (Irugacure 651, a product by Ciba Geigy Co.); and 250 parts by weight of ethylene glycol monoethyl ether.

A semiconductor silicon wafer having a vapor-deposited surface film of gold was coated with the thus prepared photoresist composition using a spin coater running at a velocity of 800 rpm followed by drying for 20 minutes in a drying oven kept at 80° C. to provide the silicon wafer with a photoresist layer having a thickness of 30 μm.

The silicon wafer was mounted on an exposure machine (Model PLA-501B, manufactured by Canon Co.) and the photoresist layer was exposed patternwise to ultraviolet light in a dose of 600 mJ/m$^2$ through a patterned negative photomask. The patternwise exposure of the photoresist layer was followed by a development treatment using 1,1,1-trichloroethane to dissolve the photoresist layer on the unexposed areas and drying to give a silicon wafer provided with a patterned photoresist layer.

The silicon wafer provided with the patterned photoresist layer was then subjected to an electrolytic gold-plating treatment in a non-cyanate electrolyte plating bath to form a gold plating layer having a thickness of 30 μm.

The gold-plated silicon wafer was then dipped in either one of the remover solutions No. 1 to No. 28 of the formulation shown below, in which TMAHaq is a 10% by weight aqueous solution of tetramethyl ammonium hydroxide, TMAHal is a 10% by weight methyl alcohol solution of tetramethyl ammonium hydroxide, TMAHeg10 is a 10% by weight solution of tetramethyl ammonium hydroxide in ethylene glycol, TMAHeg20 is a 20% by weight solution of tetramethyl ammonium hydroxide in ethylene glycol, Swasols 1800 and 1500 are each an aromatic solvent mixture supplied by Maruzen Patroleum Co., and Solvesso is an aromatic solvent mixture supplied by Exon Chemical Co.

No. 1: TMAHaq, ethylene glycol monoethyl ether and 1,2-dichlorobenzene in a weight proportion of 25:50:25

No. 2: TMAHaq, isopropyl alcohol and 1,2-dichlorobenzene in a weight proportion of 16:68:16

No. 3: TMAHaq, diethylene glycol monomethyl ether and tetrachloroethylene in a weight proportion of 14:72:14

No. 4: TMAHaq, ethyl alcohol and tetrahydrofuran in a weight proportion of 25:50:25

No. 5: TMAHaq, propylene glycol monomethyl ether and 1,2-dichlorobenzene in a weight proportion of 20:60:20

No. 6: TMAHaq, 3-methyl-3-methoxy butyl alcohol and 1,2-dichlorobenzene in a weight proportion of 15:70:15

No. 7: TMAHaq, diethylene glycol monoethyl ether and methylene chloride in a weight proportion of 30:40:30

No. 8: TMAHaq, ethylene glycol monoethyl ether and 1,2-dichlorobenzene in a weight proportion of 30:40:30

No. 9: TMAHal, ethylene glycol monobutyl ether and methylene chloride in a weight proportion of 30:40:30

No. 10: TMAHal, diethylene glycol monomethyl ether and tetrahydrofuran in a weight proportion of 20:55:25

No. 11: TMAHeg10, ethylene glycol monoethyl ether and diethylene glycol dimethyl ether in a weight proportion of 25:50:25

No. 12: TMAHeg10, ethylene glycol monoethyl ether and 4,4-dimethyl-1,3-dioxane in a weight proportion of 25:50:25

No. 13: TMAHeg10, ethylene glycol monoethyl ether and triethylene glycol dimethyl ether in a weight proportion of 25:50:25

No. 14: TMAHeg10, ethylene glycol monoethyl ether and tetraethylene glycol dimethyl ether in a weight proportion of 25:50:25

No. 15: TMAHeg10, ethylene glycol monoethyl ether and ethylene glycol diethyl ether in a weight proportion of 25:50:25

No. 16: TMAHeg10, ethylene glycol monoethyl ether and diethylene glycol diethyl ether in a weight proportion of 25:50:25

No. 17: TMAHeg10, ethylene glycol monoethyl ether and diethylene glycol dibutyl ether in a weight proportion of 25:50:25

No. 18: TMAHeg20, diethylene glycol monomethyl ether and Swasol 1800 in a weight proportion of 10:50:40

No. 19: TMAHeg20, diethylene glycol monomethyl ether and Swasol 1500 in a weight proportion of 10:50:40

No. 20: TMAHeg20, diethylene glycol monomethyl ether and Solvesso in a weight proportion of 10:50:40

No. 21: TMAHeg20, diethylene glycol monomethyl ether and benzyl alcohol in a weight proportion of 10:50:40

No. 22: TMAHeg20, diethylene glycol monomethyl ether and xylene in a weight proportion of 10:50:40

No. 23: TMAHeg20, diethylene glycol monomethyl ether and benzene in a weight proportion of 10:50:40

No. 24: TMAHeg20, diethylene glycol monomethyl ether and toluene in a weight proportion of 10:50:40

No. 25: TMAHeg20, diethylene glycol monomethyl ether and ethyl benzene in a weight proportion of 10:50:40

No. 26: TMAHeg20, diethylene glycol monomethyl ether and p-cresol in a weight proportion of 10:50:40

No. 27: TMAHeg20, diethylene glycol monomethyl ether and amyl benzene in a weight proportion of 10:50:40

No. 28: TMAHeg20, diethylene glycol monomethyl ether and naphthalene in a weight proportion of 10:50:40

The results of the removing test in Experiments No. 1 to No. 28 are shown in Table 1 below which summarizes the temperature of the remover solution, length of time for the removing treatment, uniformity (A) or phase separation (B) in the remover solution and completeness of the removing treatment given in three ratings of A, B and C according to the following criteria.

A: the photoresist layer completely dissolved and removed

B: falling of the photoresist layer in pieces and suspension of the pieces in the remover solution C: falling of the photoresist layer in pieces leaving the photoresist layer on some areas unremoved

EXAMPLE 2 (EXPERIMENTS NO. 29 AND NO. 30)

A semiconductor silicon wafer was coated on a spin coater with a positive-working photoresist composition containing a phenolic resin (OFPR-800, a product by Tokyo Ohka Kogyo Co.) followed by drying of the composition by placing the wafer for 90 seconds on a hot plate kept at 110° C. to form a photoresist layer having a thickness of 1.6 μm on the silicon wafer.

The photoresist layer on the wafer was exposed patternwise to ultraviolet light through a photomask bearing a positive pattern and then developed by using a developer solution of the recommended formulation followed by a post-baking treatment at 150° C. for 10 minutes.

The silicon wafers provided with the patterned photoresist layer in the above described manner were subjected to a removing treatment by dipping in a remover solution prepared according to the following formulation to give the results shown in Table 1.

No. 29: TMAHaq, ethylene glycol monoethyl ether and 1,2-dichlorobenzene in a weight proportion of 25:50:25

No. 30: TMAHaq, ethyl alcohol and tetrahydrofuran in a weight proportion of 25:50:25

EXAMPLE 3 (EXPERIMENTS NO. 31 TO NO. 42)

A semiconductor silicon wafer was coated on a spin coater with a positive-working photoresist composition containing a phenolic resin (PMER PRF-1200 SNC, a product by Tokyo Ohka Kogyo Co.) and then dried by evaporating the solvent in an oven kept at 80° C. to form a photoresist layer on the wafer surface.

The photoresist layer on the wafer surface was exposed patternwise to ultraviolet light through a photomask bearing a positive pattern and then developed by using a developer solution of the recommended formulation followed by a post-baking treatment at 140° C. for 10 minutes.

The silicon wafers provided with the patterned photoresist layer in the above described manner were subjected to a removing treatment by dipping in a remover solution under agitation prepared according to the following formulation to give the results shown in Table 1. The formulations No. 33 to No. 42 were for comparative purpose.

No. 31: TMAHaq, ethylene glycol monoethyl ether and 1,2-dichlorobenzene in a weight proportion of 25:50:25

No. 32: TMAHaq, ethyl alcohol and tetrahydrofuran in a weight proportion of 25:50:25

No. 33: 25% by weight methyl alcohol solution of tetramethyl ammonium hydroxide

No. 34: TMAHaq and methyl ethyl ketone in a weight proportion of 90:10

No. 35: a commercial product of chlorinated hydrocarbonbased remover solution (Sripper Remover 502, a product by Tokyo Ohka Kogyo Co.)

No. 36: TMAHaq and ethylene glycol monoethyl ether in a weight proportion of 50:50

No. 37: ethylene glycol monoethyl ether and 1,2-dichlorobenzene in a weight proportion of 50:50

No. 38: TMAHaq and 1,2-dichlorobenzene in a weight proportion of 50:50

No. 39: TMAHal and diethylene glycol monomethyl ether methyl carbitol in a weight proportion of 50:50

No. 40: TMAHal and tetraethylene glycol dimethyl ether in a weight proportion of 50:50

No. 41: TMAHal and Swasol 1800 in a weight proportion of 50:50

No. 42: TMAHeg20 and 1,4-dioxane in a weight proportion of 50:50

EXAMPLE 4 (EXPERIMENTS NO. 43 TO NO. 50)

A photopolymerization-type photoresist composition containing an acrylic resin was prepared by uniformly blending:

100 parts by weight of a copolymer of methyl methacrylate, butyl methacrylate and hydroxypropyl methacrylate in a weight proportion of 70:20:10 having a molecular weight of about 50,000;

25 parts by weight of tetraethylene glycol diacrylate;

5 parts by weight of trimethylol propane triacrylate;

5 parts by weight of 2,2-dimethoxy-2-phenyl acetophenone (Irugacure 651, a product by Ciba Geigy Co.);

3 parts by weight of diethyl thioxanthone; and 250 parts by weight of ethylene glycol monoethyl ether.

A semiconductor silicon wafer gold-plated on the whole surface by vapor deposition was coated with the above prepared photoresist composition on a spin coater running at a velocity of 800 rpm followed by drying for 20 minutes in a drying oven kept at 80° C. to form a photoresist layer having a thickness of 30 μm on the wafer surface.

In the next place, the photoresist layer on the wafer surface was exposed patternwise to ultraviolet light through a photomask bearing a negative pattern on an apparatus (Model PLA-501B, manufactured by Canon Co.) in a dose of 600 mJ/m$^2$ followed by a development treatment using 1,1,1-trichloroethane as the developer to dissolve away the photoresist layer on the unexposed area and drying to give a patterned photoresist layer on the wafer surface.

Further, the silicon wafer was subjected to electrolytic gold-plating in a non-cyanate plating bath to form a plating layer of gold having a thickness of 30 μm.

Thereafter, the thus gold-plated silicon wafers were subjected to a removing treatment of the patterned photoresist layer by dipping in a remover solution prepared according to the formulation indicated below to give the results shown in Table 1. In the following formulations, choline-aq is a 10% by weight aqueous solution of choline and choline-al is a 10% by weight solution of choline in methyl alcohol.

No. 43: choline-aq, ethylene glycol monoethyl ether and 1,2-dichlorobenzene in a weight proportion of 25:50:25

No. 44: choline-aq, diethylene glycol monomethyl ether and tetrachloroethylene in a weight proportion of 14:72:14

No. 45: choline-aq, ethyl alcohol and tetrahydrofuran in a weight proportion of 25:50:25

No. 46: choline-aq, ethylene glycol monoethyl ether and dioxane in a weight proportion of 25:50:25

No. 47: choline-al, diethylene glycol monomethyl ether and dioxane in a weight proportion of 20:55:25

No. 48: choline-aq, ethylene glycol monoethyl ether and 1,2-dichlorobenzene in a weight proportion of 30:40:30

No. 49: choline-al, ethylene glycol monobutyl ether and methylene chloride in a weight proportion of 30:40:30

No. 50: choline-al, diethylene glycol monomethyl ether and tetrahydrofuran in a weight proportion of 20:55:25

EXAMPLE 5 (EXPERIMENTS NO. 51 AND NO. 52)

A semiconductor silicon wafer was coated on a spin coater with a positive-working photoresist composition containing a phenolic resin (OFPR-800, a product by Tokyo Ohka Kogyo Co.) and dried for 90 seconds by placing the wafer on a hot plate kept at 110° C. to form a photoresist layer having a thickness of 1.6 μm on the silicon wafer.

The photoresist layer was exposed patternwise to ultraviolet light through a photomask bearing a positive pattern and then developed by using a developer solution of the recommended formulation to dissolve away the photoresist layer on the exposed area followed by a post-baking treatment at 150° C. for 10 minutes.

The silicon wafer thus provided with a patterned photoresist layer was subjected to a removing treatment by dipping in a remover solution of the formulation indicated below to give the results shown in Table 1.

No. 51: choline-aq, ethylene glycol monoethyl ether and 1,2-dichlorobenzene in a weight proportion of 25:50:25

No. 52: choline-aq, ethyl alcohol and tetrahydrofuran in a weight proportion of 25:50:25

EXAMPLE 6 (EXPERIMENTS NO. 53 TO NO. 57)

A semiconductor silicon wafer was coated on a spin coater with a positive-working photoresist composition containing a phenolic resin (PMER PRF-1200SNC, a product by Tokyo Ohka Kogyo Co.) and dried by evaporating the solvent in an oven kept at 80° C. to give a photoresist layer. The photoresist layer was exposed patternwise to ultraviolet light and subjected to a development treatment by using a developer solution of the recommended formulation followed by a post-baking treatment at 140° C. for 10 minutes.

The silicon wafer having the thus patterned photoresist layer was subjected to a removing treatment by dipping in a remover solution of the formulation indicated below to give the results shown in Table 1. The Experiments No. 55 to No. 57 were undertaken for comparative purpose.

No. 53: choline-aq, ethylene glycol monoethyl ether and 1,2-dichlorobenzene in a weight proportion of 25:50:25

No. 54: choline-aq, ethyl alcohol and tetrahydrofuran in a weight proportion of 25:50:25

No. 55: choline-aq and methyl ethyl ketone in a weight proportion of 90:10

No. 56: choline-aq and ethylene glycol monoethyl ether in a weight proportion of 50:50

No. 57: choline-aq and 1,2-dichlorobenzene in a weight proportion of 50:50

TABLE 1

| Experiment No. | Temperature of treatment, °C. | Treatment time, minutes | Miscibility of mixture | Condition of removing |
| --- | --- | --- | --- | --- |
| 1 | 60 | 10 | A | A |
| 2 | 60 | 10 | A | A |
| 3 | 60 | 10 | A | A |
| 4 | 60 | 10 | A | A |
| 5 | 60 | 10 | A | A |
| 6 | 40 | 15 | A | A |
| 7 | 60 | 10 | A | A |
| 8 | 60 | 10 | A | A |
| 9 | 60 | 15 | A | A |
| 10 | 60 | 15 | A | A |
| 11 | 60 | 30 | A | A |
| 12 | 60 | 30 | A | A |
| 13 | 60 | 30 | A | A |
| 14 | 60 | 30 | A | A |
| 15 | 60 | 30 | A | A |
| 16 | 60 | 30 | A | A |
| 17 | 60 | 30 | A | A |
| 18 | 60 | 30 | A | A |
| 19 | 60 | 30 | A | A |
| 20 | 60 | 30 | A | A |
| 21 | 60 | 30 | A | A |
| 22 | 60 | 30 | A | A |
| 23 | 60 | 30 | A | A |
| 24 | 60 | 30 | A | A |
| 25 | 60 | 30 | A | A |
| 26 | 60 | 30 | A | A |
| 27 | 60 | 30 | A | A |
| 28 | 60 | 30 | A | A |
| 29 | 60 | 30 | A | A |
| 30 | 60 | 30 | A | A |
| 31 | 60 | 30 | A | A |
| 32 | 60 | 30 | A | A |
| 33 | 60 | 30 | A | B |
| 34 | 60 | 30 | A | B |
| 35 | 130 | 300 | A | C |
| 36 | 60 | 60 | A | B |
| 37 | 60 | 60 | A | B |
| 38 | 60 | 60 | A | B |
| 39 | 60 | 30 | A | B |
| 40 | 60 | 30 | B | B |
| 41 | 60 | 30 | B | B |
| 42 | 60 | 30 | B | B |
| 43 | 60 | 30 | A | A |
| 44 | 60 | 30 | A | A |
| 45 | 60 | 30 | A | A |
| 46 | 60 | 30 | A | A |
| 47 | 60 | 30 | A | A |
| 48 | 60 | 30 | A | A |
| 49 | 60 | 30 | A | A |
| 50 | 60 | 30 | A | A |
| 51 | 60 | 30 | A | A |
| 52 | 60 | 30 | A | A |
| 53 | 60 | 30 | A | A |
| 54 | 60 | 30 | A | A |
| 55 | 60 | 30 | B | B |
| 56 | 60 | 30 | B | B |
| 57 | 60 | 30 | B | B |

We claim:

1. A remover solution for photoresist which consists essentially of, in admixture:
   (A) an aliphatic alcoholic solvent selected from the group consisting of methyl alcohol, ethyl alcohol, propyl alcohol, 3-methyl-3-methoxy butyl alcohol, ethylene glycol monomethyl ether, ethylene glycol monoethyl ether, ethylene glycol monobutyl ether, diethylene glycol monomethyl ether, diethylene glycol monoethyl ether, propylene glycol monomethyl ether and dipropylene glycol monomethyl ether in a weight fraction in the range from 35% to 80%;
   (B) an organic solvent selected from the group consisting of halogenated hydrocarbon solvents, unhydroxylated ether solvents selected from the group consisting of dioxane, tetrahydrofuran, diethylene glycol dimethyl ether, triethylene glycol dimethyl ether, tetraethylene glycol dimethyl ether, ethylene glycol diethyl ether, diethylene glycol diethyl ether and diethylene glycol dibutyl ether, and unhalogenated aromatic solvents in a weight fraction in the range from 10% to 40%; and (C) a quaternary ammonium salt in a weight fraction in the range from 0.1% to 25%.

2. The remover solution as claimed in claim 1 wherein the quaternary ammonium salt as the component (C) is selected from the group consisting of tetramethyl ammonium hydroxide, trimethyl hydroxyethyl ammonium hydroxide, tetra(hydroxyethyl) ammonium hydroxide and methyl tri(hydroxyethyl) ammonium hydroxide.

3. The remover solution as claimed in claim 1 wherein the halogenated hydrocarbon solvent as the component (B) is selected from the group consisting of 1,2-dichlorobenzene, tetrachloroethylene, trichloroethylene, methylene chloride, 1,1,1-trichloroethane, chlorobenzene, 1,2,4-trichlorobenzene, bromobenzene, 1,2-dibromobenzene, p-chlorotoluene and m-chlorotoluene.

4. The remover solution as claimed in claim 1 wherein the unhalogenated aromatic solvent as the component (B) is selected from the group consisting of benzyl alcohol, xylene, benzene, toluene, ethyl benzene, p-cresol, amyl benzene, naphthalene and a mixture of tri- and tetramethyl benzenes, alkyl toluenes, branched alkyl benzenes, cymene, diethyl benzene, naphthalene and mono- and dimethyl naphthalenes.

5. A process comprising applying a photopolymerizable photoresist material onto a substrate: exposing the photopolymerizable material to actinic rays through a mask, whereby to produce a desired pattern in said material; developing said material, whereby forming a patterned photoresist layer; and then removing the patterned photoresist layer by treating such with the remover solution claimed in claim 1.

6. The method as claim in claim 5 wherein the remover solution is as claimed in claim 2.

7. The method as claimed in claim 5 wherein the remover solution is as claimed in claim 3.

8. The method as claimed in claim 5 wherein the remover solution is as claimed in claim 4.

* * * * *